United States Patent
Shirasaki (10) Patent No.: US 6,664,874 B2
(45) Date of Patent: Dec. 16, 2003

(54) MOUNTING STRUCTURE OF HIGH-FREQUENCY WIRING BOARD

(75) Inventor: Takayuki Shirasaki, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/228,163

(22) Filed: Aug. 26, 2002

(65) Prior Publication Data
US 2003/0043558 A1 Mar. 6, 2003

(30) Foreign Application Priority Data
Aug. 28, 2001 (JP) ..................... P2001-258376

(51) Int. Cl.[7] ............................... H01P 1/00
(52) U.S. Cl. .................... 333/247; 333/250; 333/245
(58) Field of Search .................. 333/247, 250, 333/238, 245, 248, 183

(56) References Cited

U.S. PATENT DOCUMENTS

| | | | | |
|---|---|---|---|---|
| 5,805,422 A | * | 9/1998 | Otake et al. | 361/749 |
| 5,886,409 A | * | 3/1999 | Ishino et al. | 257/737 |
| 6,034,437 A | * | 3/2000 | Shibata | 257/783 |
| 6,046,077 A | * | 4/2000 | Baba | 438/127 |
| 6,137,185 A | * | 10/2000 | Ishino et al. | 257/786 |
| 6,400,576 B1 | * | 6/2002 | Davidson | 361/763 |
| 2001/0036711 A1 | * | 11/2001 | Urushima | 438/460 |

FOREIGN PATENT DOCUMENTS

JP          09-306917          11/1997

* cited by examiner

*Primary Examiner*—Brian Young
*Assistant Examiner*—John B Nguyen
(74) *Attorney, Agent, or Firm*—Hogan & Hartson

(57) ABSTRACT

The invention is a mounting structure of a high-frequency wiring board in which when a pitch between a conductive connecting member connected to a high-frequency signal electrode pad of a high-frequency wiring board and a conductive connecting member connected to a ground electrode pad adjacent thereto is denoted by A and a maximum diameter of these conductive connecting members in sections parallel to the lower face of the high-frequency wiring board is denoted by B, $A/B \geq 2$ is satisfied, and a space L1 between the lower face of the high-frequency wiring board and the upper face of the external electric circuit board is one sixteenth or less of a wavelength of high-frequency signals processed by a high-frequency semiconductor element.

8 Claims, 4 Drawing Sheets

MOUNTING STRUCTURE OF HIGH-FREQUENCY WIRING BOARD

BACKGROUND OF THE INVENTION

1. Field of the Invention

The present invention relates to a mounting structure of a high-frequency wiring board which transmits high-frequency signals in a millimeter waveband of 30 GHz or more, and more particularly relates to a mounting structure of a high-frequency wiring board in which transmission characteristics of high-frequency-signals of a connecting section to an external electric circuit board are improved.

2. Description of the Related Art

Up to now, as a mounting structure of a high-frequency wiring board which transmits high-frequency signals, a type of using a lead terminal for electric connection to an external electric circuit board has been mainstream. However, in order to decrease a transmission loss at a connecting section for high-frequency signals which have become higher, it becomes necessary to shorten the length of a connecting section to an external electric circuit board. Accordingly, adoption of a package of chip scale package (CSP) type or ball grid array (BGA) type has been pursued, which are surface mounting types of mounting an electrode pad on the lower face of a high-frequency wiring board in place of a lead terminal and connecting the electrode pad to a connecting pad on the upper face of an external electric circuit board by the use of a conductive connecting member such as solder.

A high-frequency wiring board which has a mounting structure of such a surface mounting type comprises, for example, an insulation board made of aluminum oxide sintered compact, glass ceramics sintered compact or the like and a wiring conductor made of a metallic material such as tungsten or copper. By mounting a high-frequency semiconductor element on the upper face and/or lower face of the high-frequency wiring board by the use of a wire bonding mounting method, a flip chip mounting method or the like and electrically connecting the wiring conductor of the high-frequency wiring board and an electrode of the high-frequency semiconductor element, a semiconductor device is constituted.

This high-frequency wiring board has a wiring conductor inside. The wiring conductor is placed from a high-frequency semiconductor element electrode pad formed on the upper face and/or lower face of the high-frequency wiring board to an electrode pad formed on the lower face of the high-frequency wiring board. Then, the electrode pad formed on the lower face of the high-frequency wiring board is physically and electrically joined to a connecting pad of an external electric circuit board by the use of a conductive connecting member, whereby this semiconductor device is mounted on the external electric circuit board.

In this mounting structure of a high-frequency wiring board, normally, in order to ensure stable electric conduction and ensure stable physical connection as well, an electrode pad and a conductive connecting member which have as large a diameter as possible are needed. The size relates to a space between electrode pads specified by the size of a high-frequency wiring board and the number of the electrode pads, that is, a space between a conductive connecting member connected to a high-frequency signal electrode pad and a conductive connecting member connected to a ground electrode pad adjacent thereto. In general, in a case where a space between electrode pads is 1.0 mm, the diameter of an electrode pad is 0.7 mm and the diameter of a conductive connecting member in a section parallel to the lower face of a high-frequency wiring board is 0.8 mm. Furthermore, in a case where a space between electrode pads is 0.8 mm, the diameter of an electrode pad is 0.5 mm and the diameter of a conductive connecting member in a section parallel to the lower face of a high-frequency wiring board is 0.6 mm.

So far, it has been mainstream that a frequency in a high-frequency semiconductor element is less than 10 GHz. However, in recent years, as a high-frequency semiconductor element has a faster working speed and uses a higher frequency, such a mounting structure of a high-frequency wiring board that efficiently transmits high-frequency signals of 10 GHz or more is demanded.

By contrast, the above-described conventional mounting structure of a high-frequency wiring board has a problem that impedance drastically changes owing to high stray capacity between a ground layer which a high-frequency wiring board has inside and an electrode pad on the surface, and consequently the transmission characteristic deteriorates significantly as the frequency becomes higher.

Therefore, as a technique of decreasing stray capacity in a mounting section of a high-frequency wiring board, a technique of decreasing stray capacity and improving the transmission characteristic by downsizing an electrode pad is proposed (Japanese Unexamined Patent Publication JP-A 9-306917 (1997)), for example.

However, the above-described conventional mounting structure of a high-frequency wiring board has a problem that in the case of downsizing only an electrode pad, impedance changes owing to stray capacity between a conductive connecting member and a ground layer, and consequently as the frequency becomes higher, transmission characteristics deteriorate, and especially transmission characteristics of high-frequency signals in a millimeter waveband of 30 GHz or more deteriorate.

Further, in the case of downsizing a conductive connecting member to decrease stray capacity between the conductive connecting member and a ground layer, there is a problem that in a direction along a section of the conductive connecting member parallel to the lower face of a high-frequency wiring board, induction components significantly increase and impedance drastically changes, and consequently as the frequency becomes higher, transmission characteristics deteriorate and especially transmission characteristics of high-frequency signals in a millimeter waveband of 30 GHz or more deteriorates.

SUMMARY OF THE INVENTION

The present invention was thought in view of the problems of the conventional techniques described above, and an object of the invention is to provide a mounting structure of a high-frequency wiring board which can transmit high-frequency signals in a millimeter waveband of 30 GHz or more at a connecting section between a high-frequency wiring board and an external electric circuit board, the high-frequency wiring board being mounted on the external electric circuit board via a conductive connecting member.

The invention is a mounting structure of a high-frequency wiring board comprising: a high-frequency wiring board; a high-frequency semiconductor element mounted on an upper face and/or lower face thereof; an external electric circuit board; a plurality of electrode pads formed on the lower face of the high frequency wiring board; a plurality of connecting pads formed on an upper face of the external electric circuit board; and conductive connecting members for connecting the plurality of electrode pads formed on the lower face of the high frequency wiring board and the plurality of electrode pads formed on the upper face of the external electric circuit board so as to be opposed to each other, wherein $A/B \geq 2$ is satisfied, where A is a pitch between a conductive connecting member connected to a high-frequency signal electrode pad and a conductive connecting member connected to a ground electrode pad adjacent thereto, and B is a maximum diameter of the conductive connecting members in sections parallel to the lower face of the high-frequency wiring board, and wherein a space L1 between the lower face of the high-frequency wiring board and the upper face of the external electric circuit board is one sixteenth or less of a wavelength of high-frequency signals processed by the high-frequency semiconductor element.

According to the invention, the above constitution makes it possible to decrease stray capacity between the conductive connecting member and a ground layer formed inside the high-frequency wiring board, and also makes it possible to decrease induction components in a direction along a section of the conductive connecting member parallel to the lower face of the high-frequency wiring board. As a result, an impedance change is small, and good transmission characteristics of high-frequency signals can be realized.

Further, in the above constitution, it is preferable that a transmission line drawn out of a high-frequency signal connecting pad is formed on the upper face of the external electric circuit board, and a length of the high-frequency wiring board overlapping on the transmission line is one half or less of the wavelength of the high-frequency signals.

According to the invention, it is possible to inhibit a change of impedance and radiation of electromagnetic waves due to electromagnetic field interference between the transmission line on the upper face of the external electric circuit board and the high-frequency wiring board. As a result, better transmission characteristics of high-frequency signals can be realized.

According to the invention, it is possible to provide a mounting structure of a high-frequency wiring board which can transmit high-frequency signals in a millimeter waveband of 30 GHz or more at a connecting section between a high-frequency wiring board and an external electric circuit board, the high-frequency wiring board being mounted on the external electric circuit board via conductive connecting members.

The invention is a mounting structure of a high-frequency wiring board in which a high-frequency wiring board equipped with a high-frequency semiconductor element on the upper face and/or lower face thereof and provided with a plurality of electrode pads formed on the lower face thereof which electrode pads electrically connected to electrodes of the high-frequency semiconductor element, is disposed on an external electric circuit board provided with a plurality of connecting pads formed on the upper face thereof which connecting pads are associated with the electrode pads and the plurality of electrode pads and the plurality of connecting pads are connected via conductive connecting members so as to be opposed to each other, the mounting structure of a high-frequency wiring board being characterized in that $A/B \geq 2$ is satisfied wherein A is a pitch between a conductive connecting member connected to an electrode pad for high frequency signals of the electrode pads and a conductive connecting member connected to a ground electrode pad adjacent thereto, and B is a maximum diameter of the conductive connecting members in sections parallel to the lower face of the high-frequency wiring board, and a space between the lower face of the high-frequency wiring board and the upper face of the external electric circuit board is one sixteenth or less of a wavelength of high-frequency signals processed by the high-frequency semiconductor element.

In the invention it is preferable that a transmission line drawn out of a connecting pad for high frequency signals of the connecting pads is formed on the upper face of the external electric circuit board, and a length of the high-frequency wiring board overlapping on the transmission line is one half or less of the wavelength of the high-frequency signals.

In the invention it is preferable that a frequency range of the high-frequency signals is 30 GHz or more.

The invention is a mounting structure of a high-frequency wiring board, comprising:

a high-frequency semiconductor element having a plurality of electrodes, for processing high-frequency signals of a predetermined wavelength;

an insulation board on which the high-frequency semiconductor element is mounted;

a plurality of electrode pads formed on one surface of the insulation board, the plurality of electrodes being electrically connected to the electrodes of the high-frequency semiconductor element, and including at least a high-frequency electrode pad and a ground electrode pad adjacent thereto;

an external electric circuit board on which the insulation board with the high-frequency semiconductor element mounted thereon is mounted;

a plurality of connecting pads which are formed on one surface of the external electric circuit board which one surface is opposed to the one surface of the insulation board, the plurality of connecting pads being arranged so as to correspond to an arrangement of the plurality of electrode pads, and including at least a high-frequency connecting pad and a ground pad adjacent thereto; and a plurality of conductive connecting members for electrically connecting the plurality of electrode pads with the plural connecting pads, wherein a first conductive connecting member connected to the high-frequency signal electrode pad and a second conductive connecting member connected to the ground electrode pad adjacent thereto have a pitch A;

wherein a maximum diameter B of these first and second conductive connecting members in sections parallel to the one surface of the insulation board is selected so as to be one half or less of the pitch A ($A/B \geq 2$); and wherein a space L1 between the one surface of the insulation board and the one surface of the external electric circuit board is selected so as to be one sixteenth or less of the wavelength of the high-frequency signals processed by the high-frequency semiconductor element.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Now referring to the drawings, preferred embodiments of the invention are described below.

Figure 1:
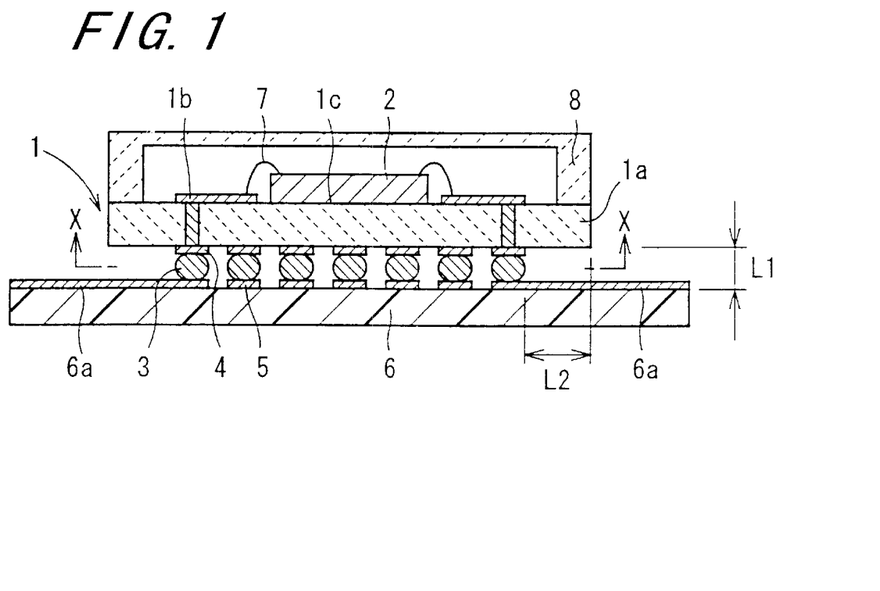
FIG. 1 is a section view showing an embodiment of a mounting structure of a high-frequency wiring board of the present invention.
Figure 2:
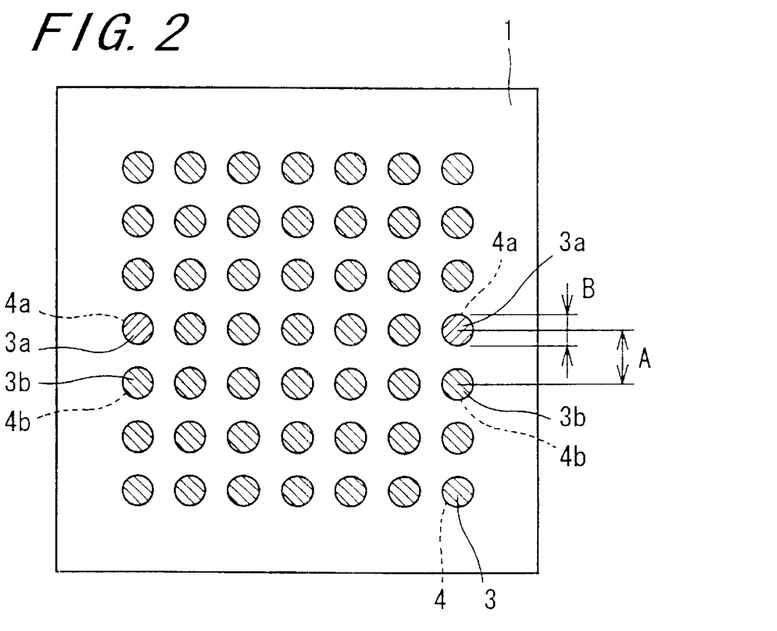
FIG. 2 is a section view taken on line X—X of FIG. 1.
Figure 3:
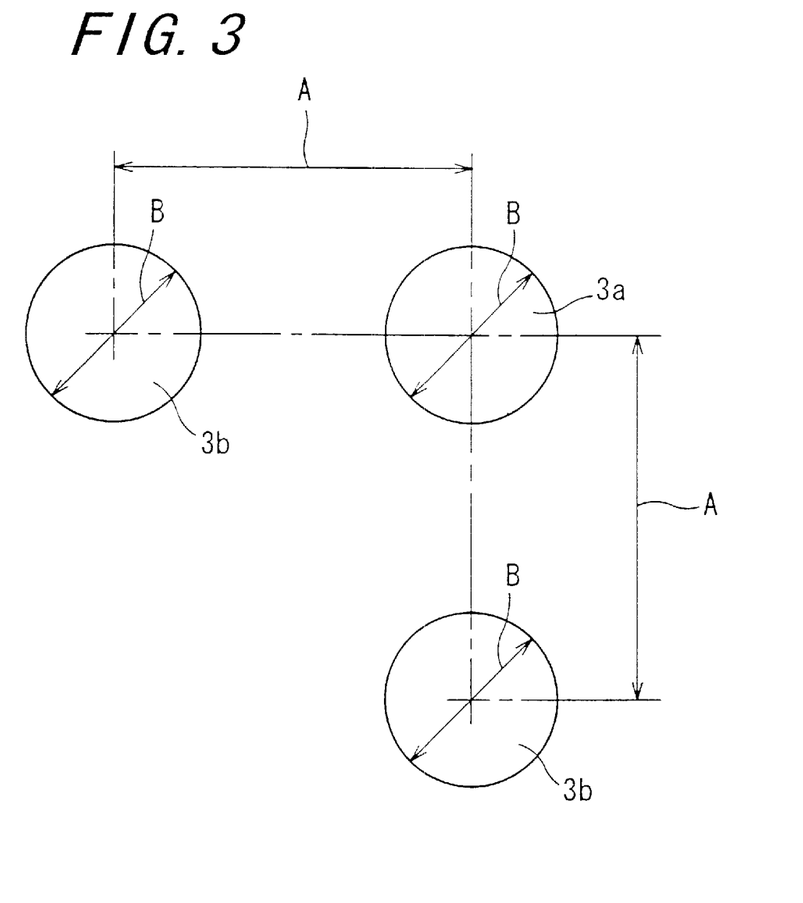
FIG. 3 is a partially enlarged view of FIG. 2.

FIG. 1 is a section view showing an embodiment of a mounting structure of a high-frequency wiring board of the present invention. FIG. 2 is a section view taken on line X—X of FIG. 1. FIG. 3 is a partially enlarged view of FIG. 2. In FIGS. 1 to 3, reference numeral 1 denotes a high-frequency wiring board, reference numeral 2 denotes a high-frequency semiconductor element, reference numeral 3 denotes a conductive connecting member, reference numeral 4 denotes an electrode pad, reference numeral 5 denotes a connecting pad, and reference numeral 6 denotes an external electric circuit board.

An insulation board 1a constituting the high-frequency wiring board 1 is a substantially quadrilateral board made of an electrically insulating material such as aluminum oxide sintered compact, aluminum nitride sintered compact, mullite sintered compact, silicon carbide sintered compact or glass ceramics sintered compact, and has a wiring conductor 1b inside. Furthermore, in the middle of the upper face of the insulation board 1a, a semiconductor element mounting portion 1c for mounting the high-frequency semiconductor element 2 is disposed.

On this semiconductor element mounting portion 1c, the high-frequency semiconductor element 2 is mounted by the use of an epoxy resin, a metallic brazing member or the like. An electrode on the high-frequency semiconductor element 2 and the wiring conductor 1b wired on the upper face of the high-frequency wiring board 1 are electrically connected to each other by a metallic thin line 7 of gold, aluminum or the like. After that, a lid 8 made of metal such as copper and aluminum or made of ceramic such as aluminum oxide sintered compact is attached onto the insulation board 1a by sealing or welding by the use of a resin such as an epoxy resin, a metallic brazing material or the like, and the high-frequency semiconductor element 2 is sealed inside. In this manner, a semiconductor device is constituted.

On the lower face, which is one surface, of the insulation board 1a, the electrode pad 4 working as a lead-out section of the wiring conductor 1b is formed. On the upper face of the external electric circuit board 6, the connecting pad 5 is formed. The electrode pad 4 and the connecting pad 5 are connected to each other by the use of the conductive connecting member 3 such as a copper ball or a solder ball. As a result, the high-frequency semiconductor element 2 and the external electric circuit board 6 are electrically connected to each other via the metallic thin line 7, the wiring conductor 1b, the electrode pad 4, the conductive connecting member 3, and the connecting pad 5.

The mounting structure of a high-frequency wiring board of the invention is characterized in that, as shown in FIGS. 1 to 3, when a pitch between a conductive connecting member 3a connected to a high-frequency signal electrode pad 4a and a conductive connecting member 3b connected to a ground electrode pad 4b adjacent thereto is denoted by A and maximum diameters of the conductive connecting members 3a, 3b in sections parallel to the lower face of the high-frequency wiring board 1 (the insulation board 1a) are denoted by B, A/B≧2 is satisfied, and a space L1 between the lower face of the high-frequency wiring board 1 and the upper face of the external electric circuit board 6 is one sixteenth or less of a wavelength of high-frequency signals processed by the high-frequency semiconductor element 2.

In other words, the first conductive connecting member 3a connected to the high-frequency signal electrode pad 4a and the second conductive connecting member 3b connected to the ground electrode pad 4b adjacent thereto have a pitch A. Maximum diameters B of these first and second conductive connecting members 3a, 3b in sections parallel to the lower face of the insulation board 1a are selected so as to be one half or less of the pitch A (A/B≧2). The space L1 between the lower face of the insulation board 1a and the upper face of the external electric circuit board 6 is selected so as to be one sixteenth or less of the wavelength of the high-frequency signals processed by the high-frequency semiconductor element 2. In the invention, "pitch" indicates a distance between the central axial line of the first conductive connecting member 3a and the central axial line of the second conductive connecting member 3b.

According to such a constitution, stray capacity between the conductive connecting member 3a and the conductive connecting member 3b, stray capacity between the conductive connecting member 3a and a ground layer inside the high-frequency wiring board 1, and induction components in a direction of a section of the conductive connecting member 3 parallel to the lower face of the high-frequency wiring board 1, which cause a problem in high-frequency signals in a millimeter waveband of 30 GHz or more, can be decreased in the following manner. In other words, the stray capacity can be decreased by separating a distance between the conductive connecting member 3a and the conductive connecting member 3b and a distance between the conductive connecting member 3a and the ground layer inside the high-frequency wiring board 1. Furthermore, the induction components can be decreased by lowering the height of the conductive connecting member 3. As a result, an impedance change is small, and good transmission characteristics of high-frequency signals can be realized.

The electrode pads 4 on the lower face of the high-frequency wiring board 1 and the connecting pads 5 on the upper face of the external electric circuit board 6 may be directly connected to each other. In the direct connection case, the space L1 is zero. When the electrode pads 4 and the connection pads 5 are connected via conductive connecting members 3 such as solder paste, the space L1 should be at least about 50 μm.

Furthermore, in order to increase the transmission characteristic of a transmission line 6a drawn out of the connecting pad 5 for high-frequency signals and formed on the upper face of the external electric circuit board 6, as shown in FIG. 1, it is preferable that a length L2 of the high-frequency wiring board 1 (the insulation board 1a) overlapping on the transmission line 6a is one half or less of a wavelength of high-frequency signals processed by the high-frequency semiconductor element 2. By setting the length L2 of the high-frequency wiring board 1 overlapping on the transmission line 6a to one half or less of the wavelength of the high-frequency signals, it is prevented that the transmission line 6a is affected by a dielectric constant of the insulation board 1a of the high-frequency wiring board 1 and the ground layer inside the high-frequency wiring board 1. Therefore, it is possible to inhibit a change of impedance of the transmission line 6a due to electromagnetic field interference between the transmission line 6a and the high-frequency wiring board 1 and electromagnetic field interference between the transmission line 6a and the ground layer inside the high-frequency wiring board 1 and radiation of electromagnetic waves from the transmission line 6a to the high-frequency wiring board 1. Accordingly, in order to obtain better transmission characteristics of high-frequency signals between the high-frequency wiring board 1 and the external electric circuit board 6, it is preferable that the length L2 of the high-frequency wiring board 1 overlapping on the transmission line 6a is one half or less of the wavelength of the high-frequency signals. The lower limit of the length L2 is zero.

As a material of the insulation board 1a of the high-frequency wiring board 1 and the external electric circuit board 6, a ceramics material such as alumina ($Al_2O_3$) ceramics and mullite ($3Al_2O_3 \cdot 2SiO_2$) ceramics, an inorganic material such as glass ceramics, or a resin material such as fluororesins like a tetrafluoroethylene resin (polytetrafluoroethylene; PTFE), a tetrafluoroethylene-ethylene copolymer resin (ETFE) and a tetrafluoroethylene-perfluoroalkoxyethylene copolymer resin (a tetrafluoroethylene-perfluoroalkylvinylether copolymer resin; PFA), a glass epoxy resin, a polyphenylene ether resin, liquid crystal polyester and polyimide are used. Further, the shapes and dimensions (thickness, width and length) of the high-frequency wiring board 1 and the external electric circuit board 6 are set with reference to a frequency of high-frequency signals to be used, characteristic impedance and so on.

The wiring conductor 1b is made by a conductor layer of a metallic material suitable for transmission of high-frequency signals. For example, the wiring conductor is made of a Cu layer, a Mo—Mn layer, a W layer, a Mo—Mn metalize layer coated with a Ni plating layer and a Au plating layer, a W metalize layer coated with a Ni plating layer and a Au plating layer, a Cr—Cu alloy layer, a Cr—Cu alloy layer coated with a Ni plating layer and a Au plating layer, a $Ta_2N$ layer coated with a Ni—Cr alloy layer and a Au plate layer, a Ti layer coated with a Pt layer and a Au plating layer, or a Ni—Cr alloy layer coated with a Pt layer and a Au plating layer, and formed by a thick film printing method, a variety of thin film forming methods and plating methods and so on. The thickness and width of the wiring conductor are also set with reference to a frequency of high-frequency signals to be transmitted, characteristic impedance and so on.

As the conductive connecting member 3, copper, Sn—Pb eutectic solder, lead rich Sn—Pb solder, or lead free solder are used.

The electrode pad 4 is formed by adhesion by using the same material and the same method as the wiring conductor 1b, for example. Other than a case of being formed as a conductor layer, the electrode pad may be formed by attaching another conductive member such as a metal plate or a metal block. Further, the electrode pad 4 may be coated like piping with the same material as the insulation board 1a. Otherwise, electrode pads 4 of the same potential may be coated with the same material as the insulation board 1a after a conductive layer is provided so as to cover a plurality of electrode pads of the same potential. In this manner, it is possible to strengthen connection between the insulation board 1a of the high-frequency wiring board 1 and the electrode pad 4. Furthermore, on the surface of the electrode pad 4, a metal such as nickel and gold, which has good conductivity, resistance to corrosion and wettability on the conductive connecting member 3, may be adhered to 0.01–20 μm in thickness by a plating method. As a result, it is possible to effectively prevent oxidation corrosion of the electrode pad 4, and it is possible to strengthen connection between the high-frequency wiring board 1 and the external electric circuit board 6 by the conductive connecting member 3.

In manufacturing of the high-frequency wiring board 1, for example, in a case where the insulation board 1a is made of glass ceramics, a green sheet of glass ceramics to become the insulation board 1a is prepared firstly, subject to a specified punching process, and coated with conductor paste such as Cu or Ag by screen printing. Secondly, the sheet is fired at 1000° C., and lastly, Ni plating and Au plating are applied on the respective conductive layers.

In the mounting structure of a high-frequency wiring board of the invention, one sixteenth of a wavelength at a frequency less than 30 GHz is 0.6 mm or more, and a change of impedance and radiation of electromagnetic waves from the transmission line 6a to the high-frequency wiring board 1 due to electromagnetic field interference between the transmission line 6a and the high-frequency wiring board 1 and electromagnetic field interference between the transmission line 6a and the ground layer inside the high-frequency wiring board 1 are hard to occur, so that a preferable frequency range of high-frequency signals is 30 GHz or more. Although the upper limit of a frequency range of high-frequency signals is not restricted specifically, in view of a use for millimeter wave radio communication which serves a current processing technique and a current need, a range of 90 GHz or less is practical. In this case, an effect of the invention can be obtained over a wide band up to 90 GHz.

[Embodiment]

An embodiment of the mounting structure of a high-frequency wiring board of the invention will be described below.

In the high-frequency wiring board 1, the insulation board 1a made of glass ceramics whose dielectric constant is 6 and made by laminating two dielectric layers which have outer dimensions of 8 mm×8 mm and each of which is 0.2 mm in thickness is used. On the upper and lower faces and an internal layer of the insulation board 1a, the wiring conductors 1b are formed by Cu metalize, respectively, and on the Cu metalize on the upper and lower faces, Ni plating layers and Au plating layers are sequentially adhered, respectively, whereby the wiring conductors 1b and the electrode pads 4 are formed. The diameter of the electrode pads 4 is set to 0.3 mm, and the electrode pads are formed at intervals of 0.8 mm in such a position as shown in FIG. 2.

Further, the external electric circuit board 6 is constituted in a manner that wiring conductors 6a of copper are formed on the upper face of a dielectric layer made of glass cloth impregnated with a fluororesin and such dielectric layers are laminated and pressed so as to be integrated. On the upper face of the external electric circuit board 6, the connecting pads 5 having a diameter of 0.3 mm are formed at intervals of 0.8 mm so as to be opposed to the electrode pads 4 formed on the high-frequency wiring board 1.

Then, the high-frequency wiring board 1 is connected to the external electric circuit board 6 by the use of solder balls 3a, 3b as conductive connecting members made of 37% by mass of tin and 63% by mass of lead which satisfy that a maximum diameter B in a section of the mounted conductive connecting member 3 parallel to the lower face of the high-frequency wiring board 1 is 0.3 mm and a space L1 between the lower face of the high-frequency wiring board 1 and the upper face of the external electric circuit board 6 is 0.25 mm. Here, the solder ball 3a connected to the high-frequency electrode pad 4a and the solder ball 3b connected to the ground electrode pad 4b adjacent thereto has a pitch A of 0.8 mm. Therefore, A/B=0.8/0.3≧2 is derived. In this manner, a sample SPA which has the mounting structure of a high-frequency wiring board of the invention is obtained.

Figure 6:
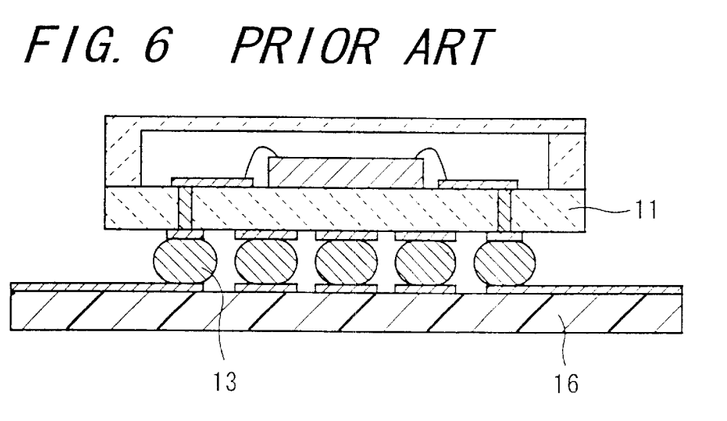
FIG. 6 is a section view showing an example of a conventional mounting structure of a high-frequency wiring board.

On the other hand, as a comparison example, as shown in FIG. 6 by a similar section view to FIG. 1, in the same manner as the sample SPA, a sample in which a high-frequency wiring board 11, an external electric circuit board 16 and conductive connecting members 13 are formed is produced. Here, by the use of solder balls made of 37% by mass of tin and 63% by mass of lead which satisfy that a maximum diameter B in a section of the mounted conductive connecting member 13 parallel to the lower face of the high-frequency wiring board 11 is 0.6 mm and a space L1 between the lower face of the high-frequency wiring board 11 and the upper face of the external electric circuit board 16 is 0.5 mm, the high-frequency wiring board 11 and the external electric circuit board 16 are connected to each other. Here, a solder ball connected to a high-frequency electrode pad and a solder ball connected to a ground electrode pad adjacent thereto has a pitch A of 0.8 mm. Therefore, A/B=0.8/0.6<2 is derived. In this manner, a sample SPB which has a conventional mounting structure of a high-frequency wiring board is obtained.

The samples SPA, SPB having the mounting structures of high-frequency wiring boards of the invention and the comparison example are connected to a network analyzer by the use of a wafer probe, and reflection losses and transmission losses to high-frequency signals are measured. The result of reflection characteristics is shown in FIG. 4, and the result of transmission losses is shown in FIG. 5.

Figure 4:
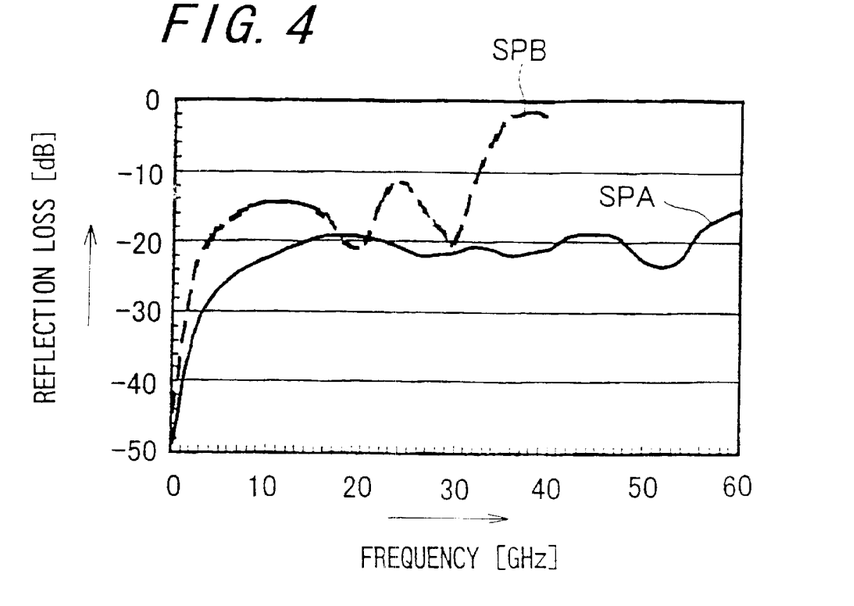
FIG. 4 is a graph showing reflection losses of high-frequency signals in mounting structures of high-frequency wiring boards of the embodiment of the invention and a comparison example.

FIG. 4 is a graph showing reflection losses in the samples SPA, SPB, where a frequency (unit: GHz) is shown on the lateral axis and a reflection loss (unit: dB) is shown on the longitudinal axis. Furthermore, of characteristic curves, a solid line shows a frequency characteristic of reflection loss of the sample SPA and a dashed line shows that of the sample SPB.

It is apparent from the result in FIG. 4 that the sample SPA of the embodiment of the invention realizes, up to a frequency of 60 GHz, a good frequency characteristic in which the reflection loss is −15 dB or less. By contrast, in the sample SPB of the comparison example, a reflection loss increases at a frequency of 30 GHz or more, and the value thereof is over −5 dB. In the sample SPA of the embodiment of the invention, such deterioration of characteristic is not recognized in the shown frequency range, and a good characteristic is obtained.

Figure 5:
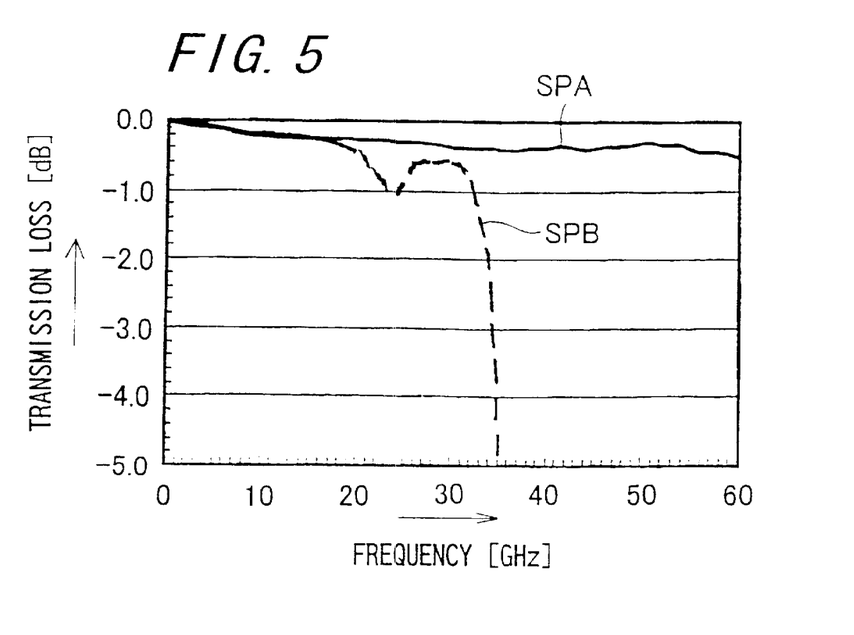
FIG. 5 is a graph showing transmission losses of high-frequency signals in the mounting structures of high-frequency wiring boards of the embodiment of the invention and the comparison example.

On the other hand, FIG. 5 is a graph showing transmission losses in the samples SPA, SPB, in which a frequency (unit: GHz) is shown on the lateral axis and a transmission loss (unit: dB) is shown on the longitudinal axis. Furthermore, of characteristic curves, a solid line shows the frequency characteristic of transmission loss of the sample SPA, and a dashed line shows that of the sample SPB.

It is apparent from the result in FIG. 5 that in the sample SPB of the comparison example, a transmission loss drastically increases from around 30 GHz, whereas in the sample SPA of the embodiment of the invention, good and flat characteristic is obtained over a wide band.

Therefore, in the mounting structure of a high-frequency wiring board of the invention, when a pitch between the conductive connecting member 3a connected to the high-frequency signal electrode pad 4a and the conductive connecting member 3b connected to the ground electrode pad 4b adjacent thereto is denoted by A and a maximum diameter of the conductive connecting members 3 in sections parallel to the lower face of the high-frequency wiring board 1 is denoted by B, A/B≧2 is satisfied, and a space between the lower face of the high-frequency wiring board 1 and the upper face of the external electric circuit board 6 is set to one sixteenth or less of a wavelength of high-frequency signals, whereby a change of impedance is small even in the case of high-frequency signals in a millimeter waveband of 30 GHz, and it can be confirmed that a good transmission characteristic can be realized over a wide band.

Further, the transmission line 6a drawn out of the connecting pad 5 for high-frequency signals is formed on the upper face of the external electric circuit board 6, and as a result of setting a length of the high-frequency wiring board 1 overlapping on the transmission line 6a to one half or less of a wavelength of high-frequency signals, a good frequency characteristic in which the reflection loss is −20 dB or less is obtained.

Here, the invention is not limited to the above embodiment, and various changes may be made without departing from the scope of the invention. For example, although the above embodiment shows a case of using the solder balls as the conductive connecting members 3, any conductive members that electrically connect the electrode pads 4 and the connecting pads 5, such as copper balls, gold bumps and solder paste, may be used other than the solder balls.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A mounting structure of a high-frequency wiring board comprising:

a high-frequency wiring board;

a high-frequency semiconductor element mounted on an upper face and/or lower face thereof;

an external electric circuit board;

a plurality of electrode pads formed on the lower face of the high frequency wiring board;

a plurality of connecting pads formed on an upper face of the external electric circuit board; and conductive connecting members for connecting the plurality of electrode pads formed on the lower face of the high frequency wiring board and the plurality of electrode pads formed on the upper face of the external electric circuit board so as to be opposed to each other, wherein A/B≧2 is satisfied, where A is a pitch between a conductive connecting member connected to a high-frequency signal electrode pad and a conductive connecting member connected to a ground electrode pad adjacent thereto, and B is a maximum diameter of the conductive connecting members in sections parallel to the lower face of the high-frequency wiring board, and wherein a space L1 between the lower face of the high-frequency wiring board and the upper face of the external electric circuit board is one sixteenth or less of a wavelength of high-frequency signals processed by the high-frequency semiconductor element.

2. The mounting structure of the high-frequency wiring board of claim 1, wherein a transmission line drawn out of a high-frequency signal connecting pad is formed on the upper face of the external electric circuit board, and a length of the high-frequency wiring board overlapping on the transmission line is one half or less of the wavelength of the high-frequency signals.

3. A mounting structure of a high-frequency wiring board in which a high-frequency wiring board equipped with a high-frequency semiconductor element on the upper face and/or lower face thereof and provided with a plurality of electrode pads formed on the lower face thereof which electrode pads electrically connected to electrodes of the high-frequency semiconductor element, is disposed on an external electric circuit board provided with a plurality of connecting pads formed on the upper face thereof which connecting pads are associated with the electrode pads and the plurality of electrode pads and the plurality of connecting pads are connected via conductive connecting members so as to be opposed to each other, the mounting structure of a high-frequency wiring board being characterized in that $A/B \geq 2$ is satisfied wherein A is a pitch between a conductive connecting member connected to an electrode pad for high frequency signals of the electrode pads and a conductive connecting member connected to a ground electrode pad adjacent thereto, and B is a maximum diameter of the conductive connecting members in sections parallel to the lower face of the high-frequency wiring board, and a space between the lower face of the high-frequency wiring board and the upper face of the external electric circuit board is one sixteenth or less of a wavelength of high-frequency signals processed by the high-frequency semiconductor element.

4. The mounting structure of the high-frequency wiring board of claim 3, wherein a transmission line drawn out of a connecting pad for high frequency signals of the connecting pads is formed on the upper face of the external electric circuit board, and a length of the high-frequency wiring board overlapping on the transmission line is one half or less of the wavelength of the high-frequency signals.

5. A mounting structure of a high-frequency wiring board, comprising:

a high-frequency semiconductor element having a plurality of electrodes, for processing high-frequency signals of a predetermined wavelength;

an insulation board on which the high-frequency semiconductor element is mounted;

a plurality of electrode pads formed on one surface of the insulation board, the plurality of electrodes being electrically connected to the electrodes of the high-frequency semiconductor element, and including at least a high-frequency electrode pad and a ground electrode pad adjacent thereto;

an external electric circuit board on which the insulation board with the high-frequency semiconductor element mounted thereon is mounted;

a plurality of connecting pads which are formed on one surface of the external electric circuit board which one surface is opposed to the one surface of the insulation board, the plurality of connecting pads being arranged so as to correspond to an arrangement of the plurality of electrode pads, and including at least a high-frequency connecting pad and a ground pad adjacent thereto; and a plurality of conductive connecting members for electrically connecting the plurality of electrode pads with the plural connecting pads, wherein a first conductive connecting member connected to the high-frequency signal electrode pad and a second conductive connecting member connected to the ground electrode pad adjacent thereto have a pitch A;

wherein a maximum diameter B of these first and second conductive connecting members in sections parallel to the one surface of the insulation board is selected so as to be one half or less of the pitch A ($A/B \geq 2$); and wherein a space L1 between the one surface of the insulation board and the one surface of the external electric circuit board is selected so as to be one sixteenth or less of the wavelength of the high-frequency signals processed by the high-frequency semiconductor element.

6. The mounting structure of the high-frequency wiring board of claim 1, wherein a frequency range of the high-frequency signals is 30 GHz or more.

7. The mounting structure of the high-frequency wiring board of claim 3, wherein a frequency range of the high-frequency signals is 30 GHz or more.

8. The mounting structure of the high-frequency wiring board of claim 5, wherein a frequency range of the high-frequency signals is 30 GHz or more.

* * * * *